United States Patent [19]

Babu et al.

[11] Patent Number: 4,810,326

[45] Date of Patent: Mar. 7, 1989

[54] INTERLAMINATE ADHESION BETWEEN POLYMERIC MATERIALS AND ELECTROLYTIC COPPER SURFACES

[75] Inventors: Suryadevara V. Babu, Potsdam; Vu Q. Bui, Endicott; Joseph G. Hoffarth; John A. Welsh, both of Binghamton, all of N.Y.

[73] Assignee: International Business Machines Corporation, Armonk, N.Y.

[21] Appl. No.: 91,549

[22] Filed: Aug. 31, 1987

[51] Int. Cl.[4] .......................... B32B 31/28; C25D 1/00
[52] U.S. Cl. .................................... 156/629; 156/643; 156/151; 156/272.6; 156/902

[58] Field of Search ...................... 156/150, 151, 272.6, 156/629, 643, 901, 902, 646; 427/38, 39, 41, 327, 410, 309

[56] References Cited

U.S. PATENT DOCUMENTS

| | | | |
|---|---|---|---|
| 4,654,115 | 3/1987 | Egitto et al. | 156/643 |
| 4,689,111 | 9/1987 | Chan et al. | 156/643 |
| 4,642,161 | 2/1987 | Akahoshi et al. | 156/902 X |

Primary Examiner—David L. Lacey
Assistant Examiner—Andrew J. Anderson
Attorney, Agent, or Firm—Perman & Green

[57] ABSTRACT

A method for improving the adhesion of a polymer such as an epoxy resin to an electrolytic copper surface wherein the copper surface to be adhered is exposed to gas plasma containing a fluorohydrocarbon.

8 Claims, No Drawings

INTERLAMINATE ADHESION BETWEEN POLYMERIC MATERIALS AND ELECTROLYTIC COPPER SURFACES

BACKGROUND OF THE INVENTION 1. Field of the Invention

This invention relates to a method of improving the adhesion between a polymeric material and an electrolytic copper surface and more particularly to the adhesion of an epoxy resin to an electrolytic copper substrate such as is used in the manufacture of electronic printed circuit boards. 2. The Prior Art In many applications, it is essential to provide strong adherence between a metallic surface and a polymeric surface. Examples of such uses are widely diversified. For example, the strong adherence of metal to polymer is critical in the manufacture of multilayer printed circuit boards in the electronics, telecommunications, computer and other industries.

In the manufacture of electronic devices, such as computers, printed circuit boards are widely used to support discrete electronic components and to provide the electrical circuitry between the components. The printed circuit boards are composite structures having a central core, typically a dielectric material such as glass fiber and a thermosetting resin such as an epoxy, phenolic polyester or other thermosetting resin, referred to in the art as a "prepreg". The prepreg has applied on either side thereof, metallized circuitry, usually formed of a metal film layer such as copper. The metal film layer is etched or otherwise processed to provide circuits of predetermined geometrical configuration. The printed circuit board may be a two-sided composite board having circuitry on the top and bottom sides of the dielectric layer, or it may be laminated multilayer board which also contains internal signal lines and power planes separated by the dielectric polymeric material. The laminated multilayer printed circuit boards are prepared from individual composite circuit boards which are laminated to form the multilayer structure having the etched metal circuitry sandwiched between the prepreg layers. The laminated multilayer boards are provided with via holes and interstitial via holes to interconnect the various circuit lines and power planes.

Various methods have been employed for providing a metal film layer on one side of a prepreg substrate which is to be laminated to form a multilayer printed circuit board. Such methods include deposition by vacuum metallization and electrolytic plating. While electrolytic plating has become a desirable and cost efficient method of depositing metal film layers such as copper onto polymeric prepreg substraes, the adhesion of such layer after deposition to other polymeric substrates is often less than adequate, especially with respect to polymers such as epoxy resins. Copper, when electrolytically plated, is in its pure form and like other pure metals, generally exhibits poor adhesion characteristics for bonding to polymeric substrates. For example, it has been determined that in order for a multilayer printed circuit board having copper signal lines sandwiched between dielectric layers formed from epoxy resins to meet commercial specifications, it is required that the interlaminate bond strength between the copper film layer and the opposed dielectric layer be at least about 2.5 pounds pull per inch (lbs/in.). If an attempt to laminate an untreated copper coated epoxy substrate to an epoxy based substrate were made, the interlaminate bond strength would generally be found to be less than about 2 lbs/in.

To improve the interlaminate bond strength of electrolytic plated copper films to epoxy resin based dielectrics, it has been the practice in the art to treat the copper film surface prior to lamination with a solution of sodium chlorite and sodium hydroxide at temperatures near boiling to convert the copper film surface to a more adherent copper oxide. Such a solution generally contains 3 to 8% by weight chlorite. This chlorite treatment step generally raises the interlaminate bond strength of the copper film layer to about 5.0-10.0 lbs/in.

A drawback to the chlorite adhesion promoting treatment, which has been used since the early days of printed circuit technology is that the oxide coatings formed are often non-uniform, resulting in areas of poor copper-to-polymer adhesion after lamination. Particular care must be paid to the thickness of the oxide coating, i.e. it must be very uniform or else poor adhesion will result.

Another drawback to the chlorite treatment step is that the copper metal surface must be cleaned with surfactants and highly corrosive mineral acids prior to immersion in the chlorite solution. The present process does not require such a cleaning pre-step.

A further drawback to the chlorite treatment is that the concentrated solutions used to effect a chemical conversion of copper to copper oxide to promote adhesion also tend to undercut the deposited copper film layer, i.e., laterally undermine the conductor paths on the circuit patterns etched in the prepreg surface.

Another main disadvantage to the use of chlorite solutions for the enhancement of polymer adhesion during lamination to metallized surfaces is that the spent chlorite solutions are hazardous chemicals and create disposal problems which arise from the fact that generally they cannot be simply discarded without appropriate treatment to avoid pollution, thereby increasing the expense of using the treatment.

U.S.S.N. 923,977, filed Oct. 28, 1986, now U.S. Pat. No. 4,689,111, discloses a general two-step process for improving the adhesion of a polymer to a metal surface by (i) impinging on the metal surface a pressurized slurry stream in which is suspended metal oxide, i.e. alumina, particles and then (ii) exposing the metal oxide treated metal surface in a gaseous plasma containing a fluorohydrocarbon. It has now been discovered that when the metal surface is electrolytic copper, the metal oxide treatment step is not required to obtain good adhesion.

OBJECTS AND SUMMARY OF THE INVENTION

Accordingly, it is a principal object of this invention to provide an improved process for enhancing the adhesion of polymeric layers laminated to electrolytic copper metal surfaces to prepare multilayer articles particularly adapted for the manufacture of printed circuit boards.

Another object is to provide an improved process for promoting the adhesion of electrolytic copper circuit lines in the internal layers of a multilayer printed circuit board to opposed dielectric substrates.

A still further object is to provide an improved process for promoting adhesion between interplane electrolytic copper circuit lines and printed circuit board dielectric epoxy surfaces without the use of corrosive chemicals or pressurized metal oxide slurries.

The foregoing and other objects and advantages are accomplished in accordance with the process of the present invention wherein the adhesion of electrolytic copper to polymeric epoxy substrates is improved by surface treating the electrolytic copper surface in a plasma environment containing a fluorohydrocarbon.

As will hereinafter be further demonstrated by using the fluorohydrocarbon plasma treatment step, the interlaminate bond strength values of a film of electrolytic copper, to an opposed polymeric surface, such as an epoxy polymer, are found to be in excess of 5.0 lbs/in., thereby eliminating the need for the use of corrosive chemical reagents or pressurized slurries to effect the promotion of interlaminate adhesion.

DESCRIPTION OF THE PREFERRED EMBODIMENTS

The foregoing and other objects and advantages of the present invention will become more readily apparent from the detailed description of the preferred embodiments.

The electrolytic copper surface treated according to the present invention may be any electrolytic copper. By "electrolytic copper" is meant copper deposited by an electro-plating process in which one can selectively build up a layer of copper to a desired thickness of several mils.

An example of an electrolytic copper film which can be deposited on epoxy dielectric surfaces and laminated to opposed epoxy based prepregs to prepare printed circuit boards is one prepared by electrolytic metallizing techniques wherein the surface of the polymeric epoxy substrate is first conditioned or activated to receive a copper deposit by seeding the surface with a colloidal palladium-tin catalyst and then electrolytically plating a copper film on the activated surface using a plating bath containing a sacrificial copper anode, sulfuric acid solution as the electrolyte, and a brightening agent to more evenly distribute the plating across the activated surface. These metal films are typically deposited at a thickness of about 0.001–0.002 inches or about 250–500 microns.

The deposited electrolytic copper film layer is treated in accordance with the present invention by exposing it to a gaseous fluorohydrocarbon to effect fluorination of the copper surface thereof which serves to improve its adhesion.

In the fluorohydrocarbon plasma exposure of the present invention, the electrolytic copper surface to be plasma treated is exposed to a plasma generated in a reactor of the type used for plasma etching. The practice of plasma etching is well established in the art, e.g. U.S. Pat. Nos. 3,795,557, 4,157,251, 4,180,432, 4,357,203, 4,374,699, 4,460,436, 4,482,427 and 4,487,652.

In effecting plasma treatment in accordance with the practice of the present invention, the plasma gas is comprised of a volatile fluorohydrocarbon of no more than two carbon atoms and in which the carbon atoms are attached to a predominance of fluorine atoms. Exemplary of such fluorohydrocarbons are $CF_4$, $C_2F_6$, $CHF_3$, and $C_2H_2F_4$. The fluorohydrocarbon may be used alone or as a mixture with or without oxygen and/or an inert gas such as argon or nitrogen. When gaseous mixtures are used for generating the plasma the mixture generally contains, on a volume basis, from about 5 to about 100 percent of the fluorohydrocarbon and from about 95 to about 0 percent oxygen. Preferably, the gaseous mixture contains about 20 to about 50 volume percent of the fluorohydrocarbon and about 80 to about 50 volume percent oxygen. Carbon tetrafluoride ($CF_4$) is the fluorohydrocarbon gas preferred for use in the plasma treatment of the process of the present invention.

The plasma treatment of the present invention is conveniently conducted in a parallel plate reactor of the type conventionally used for plasma etching. In such reactor, there are one or more pairs of parallel plate electrodes with one electrode in each pair powered to between about 2000 and 4000 watts (RF) and the other electrode in each pair grounded. The total gas pressure utilized is typically about 100 to 400 m Torr and the total gas flow is typically about 1500 to 3000 sccm.

In practicing the plasma treatment of the present invention, the electrolytic copper coated dielectric substrate to be treated is placed between a grounded and a RF-powdered electrode pair so that the substrate is electrically isolated from the electrodes. A gas containing the fluorohydrocarbon compound with or without the inclusion of oxygen or inert gas is introduced into the reactor and a radio frequency (RF) power is applied between the powered and grounded electrodes to produce a plasma between them. The substrate material is exposed to this fluorohydrocarbon containing plasma for about 10 to about 30 minutes.

The electrolytic copper surface treated in accordance with the present invention can then be laminated to a polymeric material such as a dielectric substrate material. Suitable dielectric substrate materials include both thermoplastic and thermosetting polymers, though preferably thermosetting polymers. Typical thermosetting polymeric materials to which the copper surface may be laminated include epoxy, phenolic based materials and polyimides. The dielectric materials may be molded articles of the polymers containing fillers and/or reinforcing agents such as glass-filled epoxy or phenolic based materials. Examples of some phenolic type materials include copolymes of phenol, resorcinol and cresol. Examples of some suitable thermoplastic polymeric materials include polyolefins, such as polypropylene, polysulfones, polycarbonates, nitrile rubbers and ABS polymers.

Bonding of an electrolytic copper coated polymeric substrate to a second polymeric material is conveniently carried out by pressing together opposed faces of a sheet of the second polymeric material and the sheet of the electrolytic copper coated polymeric substrate, the copper surface of which has been prepared according to the present invention with the treated surface of the copper-coated polymeric substrate next to or confronting an opposed surface of the polymeric material, in a preheated laminating press at a predetermined pressure and temperature. The time of the pressing operation is variable depending upon the particular dielectric substrate material employed and the pressure employed. About 1 to 2 hours are adequate for the above conditions. The pressing can be done by loading a stack of panels on top of each other in the press. A practical amount is about 12 panels.

A laminate particularly suitable for use in the preparation of a multilayer printed circuit board using electrolytic copper film surfaces treated in accordance with the process of this invention is prepared, for example, by placing a prepreg sheet comprised of a B-stage thermosetting epoxy resin impregnated glass fabric sheet in a laminating press on top of an electrolytic copper film layer deposited on an epoxy impregnated glass fabric sheet, the copper layer having been previously treated with the plasma treatment of the present invention. The B-stage thermosetting epoxy resin of the prepreg sheet is further cured under the influence of heat and pressure.

The actual bonding of the B-stage prepreg to the treated electrolytic copper film surface is accomplished by simultaneously pressing the laminating components together and baking at a temperature of about 250° F. to about 450° F., and preferably at about 300° F. to 400° F. at a pressure of about 5 to 1,000 psig for a period of time ranging from about 5 minutes to 120 minutes.

The copper film thickness may vary widely although, preferably, it will generally range from about 0.001 inch to about 0.003 inch in thickness. In a like manner, the thickness of the thermosetting or thermoplastic resin substrate utilized may vary from about 0.015 inch to 0.125 inch, or more, as by increasing the number of plies of prepreg in the laminating step.

The following examples further illustrate the invention, it being understood that the invention is in no way intended to be limited to the details described therein.

EXAMPLE I A laminated signal core was prepared starting with an epoxy laminate having a thickness of about 0.01 inch having a 0.002 inch thick layer of electrolytic deposited copper was rinsed in deionized water to clean the surface and then was dried by pressurized air. The 600×700 mm treated copper coated laminate was placed in a parallel electrode plasma reactor between an RF powered electrode and a grounded electrode in the plasma reactor. The lower electrode was RF powered and the upper electrode was grounded. The input RF power was 3500 watts and the pressure during etching was 350 mTorr. The total gas flow averaged about 2000 sccm. Plasma treatment was carried out for 10 minutes using a gas mixture containing 30% $CF_4$ and 70% $O_2$. The dried sample was then laminated to an epoxy prepreg by a conventional multilayer (4 layers) procedure; i.e. 340 psi at 320° F. for 80 minutes.

The so-prepared laminate signal core was subjected to the following standard peel test: Measure the peel value (in pounds) of a 1 inch wide strip when pulled at a 90° angle from the substrate at a rate of 1 inch/minute.

The peel values of the laminate in which the copper film surface was prepared in accordance with this Example I was greater than 9.5 lbs/in.

EXAMPLE II

A laminated power core was prepared by laminating two 600×700 mm sheets of electrolytic copper foil, each about 1.4 mils thick, to either side of a B-staged epoxy prepreg laminate. The power core lamination was completed by a conventional multilayer procedure, i.e. 1000 psi at 340° F. for 110 minutes. The copper surfaces were then plasma treated as in Example I. The power core was then subjected to the peel test and exhibited a peel value of 9.5 lbs/in.

EXAMPLE III

The procedures of Examples I and II were repeated to prepare signal core and power core samples which were then subjected to a laminate bond peel test in accordance with Example I. The results along with those for untreated and conventional chlorite treated samples were:

| Sample | Laminate Bond Peel (lb/in) | |
| --- | --- | --- |
|  | Front | Back |
| Signal | Cu peeled | 10+ |
| Signal | 3.0 | 10+ |
| Signal | 10+ | 10+ |
| Power | Cu peeled | 9.3 |
| Power | 9.3 | 10+ |
| Power | 9.3 | 7.0 |
| Untreated | 1-2 | 1-2 |
| Chlorite Signal | 8.3 | 5.0 |
| Chlorite Power | 9.3 | 8.0 |

As can be seen, typical interlaminate bond strengths for chlorite, treated copper to epoxy range from 5.0 to 9.0+lb/in while untreated copper to epoxy is only about 1-2 lb/in. The interlaminate bond strengths using the process of the present invention are generally greater than 9 lb/in. The results indicated as "cu peeled" showed no adhesion and were found to be associated with poor lamination and sample preparation techniques.

EXAMPLE IV

The procedure of Example III was repeated except that the plasma was maintained for only 5 minutes instead of 10. The results of the laminate bond peel test were:

| Sample | Laminate Bond Peel (lb/in) | |
| --- | --- | --- |
|  | Front | Back |
| Signal | 10+ | 10+ |
| Signal | Cu peeled | 10+ |
| Signal | Cu peeled | Cu peeled |
| Power | 9.3 | 5.6 |
| Power | 9.1 | 10+ |
| Power | 9.3 | 9.3 |

While specific components of the present system are defined above, many other variables may be introduced which may in any way affect, enhance, or otherwise improve the system of the present invention. These are intended to be included herein.

Although variations are shown in the present application, many modifications and ramifications will occur to those skilled in the art upon a reading of the present disclosure. These, too, are intended to be included herein.

What is claimed is:

1. A method for producing a strong interlaminate bond between at least one surface of at least one electrolytic copper substrate and at least one polymeric material in the absence of impinging a slurry of suspended metal oxide particles on the copper surface, which comprises exposing the said electrolytic copper surface in a gaseous plasma containing a fluorohydrocarbon to etch said surface, and then laminating the etched electrolytic copper surface to a polymeric material to form a strong interlaminate bond therebetween.

2. The method of claim 1 wherein the polymeric material comprises a polymeric substrate formed from a thermosetting resin.

3. The method of claim 2 wherein the thermosetting resin is an epoxy resin.

4. The method of claim 1 wherein the fluorohydrocarbon is $CF_4$.

5. The method of claim 1 wherein the gaseous plasma is formed from a mixture of a fluorohydrocarbon and oxygen.

6. The method of claim 5 wherein the gaseous plasma is formed from a mixture of about 20 to 50 volume percent fluorohydrocarbon and about 50 to 80 volume percent oxygen.

7. The method of claim 1 which comprises exposing the electrolytic copper surface of a copper coated polymeric substrate in a gaseous plasma containing a fluorohydrocarbon to etch said copper surface, and laminating said etched surface to another polymeric material to form a signal core.

8. The method of claim 1 which comprises exposing the surfaces of two different electrolytic copper substrates in a gaseous plasma containing a fluorohydrocarbon to etch both of said surfaces, and laminating both of said etched surfaces to a single polymeric material to form a power core.

* * * * *